(12) United States Patent
Jung et al.

(10) Patent No.: US 9,713,281 B2
(45) Date of Patent: Jul. 18, 2017

(54) HINGE DEVICE AND DISPLAY APPARATUS WITH A HINGE DEVICE USING A SLIDING POSITION

(71) Applicant: SAMSUNG ELECTRONICS CO., LTD., Suwon-si (KR)

(72) Inventors: Jin Jung, Incheon (KR); Bo Ram Park, Suwon-si (KR); Se Ki Jang, Hwaseong-si (KR); Yong Sub Jung, Suwon-si (KR); Woo Young Kan, Seongnam-si (KR); Sung Gi Kim, Suwon-si (KR); Hyun Jun Jung, Yongin-si (KR); You Sik Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 39 days.

(21) Appl. No.: 14/149,542

(22) Filed: Jan. 7, 2014

(65) Prior Publication Data

US 2014/0192505 A1    Jul. 10, 2014

Related U.S. Application Data

(60) Provisional application No. 61/749,470, filed on Jan. 7, 2013.

(30) Foreign Application Priority Data

May 9, 2013    (KR) .................. 10-2013-0052293

(51) Int. Cl.
*H05K 7/16* (2006.01)
*F16M 11/10* (2006.01)
*F16M 11/22* (2006.01)

(52) U.S. Cl.
CPC ............... *H05K 7/16* (2013.01); *F16M 11/10* (2013.01); *F16M 11/22* (2013.01); *F16M 2200/041* (2013.01)

(58) Field of Classification Search
CPC .......... H05K 7/16; F16M 11/10; F16M 11/22; F16M 2200/041; G06F 1/1601;
(Continued)

(56) References Cited

U.S. PATENT DOCUMENTS 6,288,891 B1 *  9/2001  Hasegawa .............. F16M 11/10
                                                    248/923
7,651,062 B2 *  1/2010  Matsutani .............. F16M 11/10
                                                    248/176.3

(Continued)

FOREIGN PATENT DOCUMENTS

EP    1 331 431 A2    7/2003
EP    1 331 431 A3    7/2003
EP    1 655 532 A1    5/2006

OTHER PUBLICATIONS

Communication dated May 9, 2016 issued by European Patent Office in counterpart European Patent Application No. 14150319.3.

*Primary Examiner* — Jerry Wu
*Assistant Examiner* — Stephen Sul
(74) *Attorney, Agent, or Firm* — Sughrue Mion, PLLC

(57) ABSTRACT

A display apparatus which enables a display to rotate with a tilting angle across a large range is provided. This allows a user to, conveniently use the display apparatus in order to enable quality of use to be improved during a tilting operation, and slim and elegant appearance to be implemented. The display apparatus includes a display configured to display an image on the front surface, a stand supporting the display, and a hinge device connecting the display to the stand such that the display may be tilted, wherein the hinge device includes a guide member formed on a rear surface of (Continued)

the display, a latch fixed to the stand and to slide along the guide member when the display is tilted, and a fixing member fixing the display not to move when an external force applied to the display is removed.

17 Claims, 13 Drawing Sheets

(58) Field of Classification Search
CPC .... G06F 1/1637; G06F 1/1613; G06F 1/1616; G06F 1/1633
USPC ...... 361/809, 679.07, 679.6, 679.01, 679.21, 361/679.26, 679.27, 679.55, 679.02; 248/122.1
See application file for complete search history.

(56) References Cited

U.S. PATENT DOCUMENTS

| | | |
|---|---|---|
| 2008/0034543 A1* | 2/2008 | Hsu ........................ F16M 11/10 16/346 |
| 2008/0137274 A1* | 6/2008 | Watanabe .............. F16M 11/10 361/679.07 |
| 2009/0261223 A1 | 10/2009 | Nagaoka et al. |
| 2010/0091438 A1* | 4/2010 | Dittmer .................. F16M 11/10 361/679.01 |
| 2011/0155869 A1 | 6/2011 | Chen |
| 2011/0303803 A1 | 12/2011 | Skinner et al. |
| 2013/0170119 A1* | 7/2013 | Lai ....................... H05K 5/0226 361/679.02 |
| 2013/0170122 A1* | 7/2013 | Lai ........................... G06F 1/16 361/679.6 |

\* cited by examiner

US 9,713,281 B2

HINGE DEVICE AND DISPLAY APPARATUS WITH A HINGE DEVICE USING A SLIDING POSITION

CROSS-REFERENCE TO RELATED APPLICATION

This application claims the benefits of U.S. Patent Application No. 61/749,470, filed on Jan. 7, 2013 in USPTO and Korean Patent Application No. P2013-52293, filed on May 9, 2013 in the Korean Intellectual Property Office, the disclosures of which are incorporated herein by reference, in their entirety.

BACKGROUND

1. Field

The exemplary embodiments relate to a display apparatus having a hinge device using a sliding method.

2. Description of the Related Art

A display apparatus is a kind of an image output apparatus such as a TV, monitor, etc. The display apparatus includes a display on which images are displayed, and a stand which supports the display.

The display may be mounted on a stand such that the display may rotate or its height may be adjusted, for the convenience of a user. For example, the display may be connected to the stand by a hinge device in order to forwardly or backwardly rotate, so that the display apparatus may be tilted.

In the related art a display apparatus on which a hinge device is mounted is formed to be tilted by rotating with respect to a hinge axis. The display apparatus of the related art on which the hinge device is mounted may include a display disposed vertical to a bottom surface on which the display apparatus is disposed, and may be tilted by rotating by about 20 degrees while the display is vertical with respect to the bottom surface.

Currently, a display apparatus in which selection of a menu is operated by touching a touch screen formed on a front surface has been implemented. A user watches and touches an image displayed on the front surface of a display, so that operations such as selection of a menu, adjustment of the size of an image, locations of images, etc. may be conveniently carried out.

SUMMARY

It is an aspect of the exemplary embodiments to provide a hydraulic hinge or a hinge device using a leaf spring, so that a display can be tilted at various angles in order to be connected to a stand.

In accordance with one aspect of the exemplary embodiments, a display apparatus, having a display configured to display an image on the front surface thereof, a stand configured to support the display, and a hinge device connecting the display to the stand such that the display is tilted, wherein the hinge device is configured to include a guide member formed on a rear surface of the display, a latch fixed to the stand and sliding along the guide in response to the display being tilted, and a fixing member fixing the display such that the display is not moved when an external force applied to the display is removed.

The fixing member may be a hydraulic hinge configured to receive fluids in a cylinder.

The hydraulic hinge may include a piston received in the cylinder, and the piston may reciprocate in the cylinder in response to a force greater than the hydraulic power of the hydraulic hinge being applied to the display.

The hydraulic hinge may include a surface mounted on the rear surface of the display along an axis of rotation, and may rotate with respect to the axis of rotation in response to the display being tilted.

The latch may be connected to the stand by the fixing bracket.

The hydraulic hinge may include another side on which the latch is connected to the fixing bracket.

The hydraulic hinge may be rotatably mounted on the fixing bracket along an axis of rotation.

The guide member may include a rail member that slides by inserting the latch into the guide member.

The display may be configured to have a tilting angle limited by the length of the rail member.

The hydraulic hinge may include a side mounted on the display, and the other side of the hydraulic hinge may be mounted on the stand, so that the hydraulic hinge is reduced or extended by the external force applied to the display, and the display is tilted.

The fixing member may be implemented as a leaf spring including one end fixed to the rear surface of the display, and another end formed on a free end.

The apparatus may further include a pressure member configured to pressurize the leaf spring on the rear surface of the display.

The pressure member may pressurize the leaf spring to move along the leaf spring in response to the display being tilted.

The pressure member may be configured to apply a force to the leaf spring in an opposite direction to an elastic force applied to the pressure member by the leaf spring.

The pressure member may include an elastic member mounted thereon, and a direction of an elastic force of the elastic member may be opposite to a direction of an elastic force of the leaf spring.

The pressure member may include a roller configured to pressurize the fixing member and moving along the fixing member.

In accordance with another aspect of the exemplary embodiments, a hinge device mounted on a stand such that a display is tilted is configured to include a fixing member mounted on a rear surface of the display, and supporting the display such that the display is maintained to be tilted at a predetermined angle, and a fixing bracket connecting the fixing member to the stand.

The fixing member may include a hydraulic hinge in which fluids fill the inside of a cylinder, and the display may be tilted only in response to an external force greater than the hydraulic power in the cylinder being applied.

The hydraulic hinge may be configured to include one side mounted on the rear surface of the display and the other side connected to the stand, so that the hydraulic hinge may be reduced or extended as the display is tilted.

The stand may include a pressure member configured to pressurize the fixing member, and the fixing member may be implemented as a leaf spring with an elastic force acting in an opposite direction to the force applied to the fixing member by the pressure member.

An aspect of an exemplary embodiment may provide a display apparatus including: a hinge device configured to connect a display to a stand such that the display is tilted, wherein the hinge device includes a guide member, a latch configured to slide along the guide member when an external force is provided to tilt the display, and a fixing member configured to fix the display such that the display is not moved when the external force applied to the display is removed.

The display apparatus may further include a display configured to display an image on a front surface thereof. The display apparatus may further include a stand configured to support a display.

The guide member may be formed on a rear surface of the display apparatus. The latch may be fixed to the stand. In addition, the guide member may include a rail member that slides by inserting the latch into the guide member.

BRIEF DESCRIPTION OF THE DRAWINGS

These and/or other aspects of the exemplary embodiments will become apparent and more readily appreciated from the following description, taken in conjunction with the accompanying drawings of which:

FIG. 1 is a perspective view of a display apparatus viewed from a front side according to an exemplary embodiment of;

DETAILED DESCRIPTION

Figure 1:
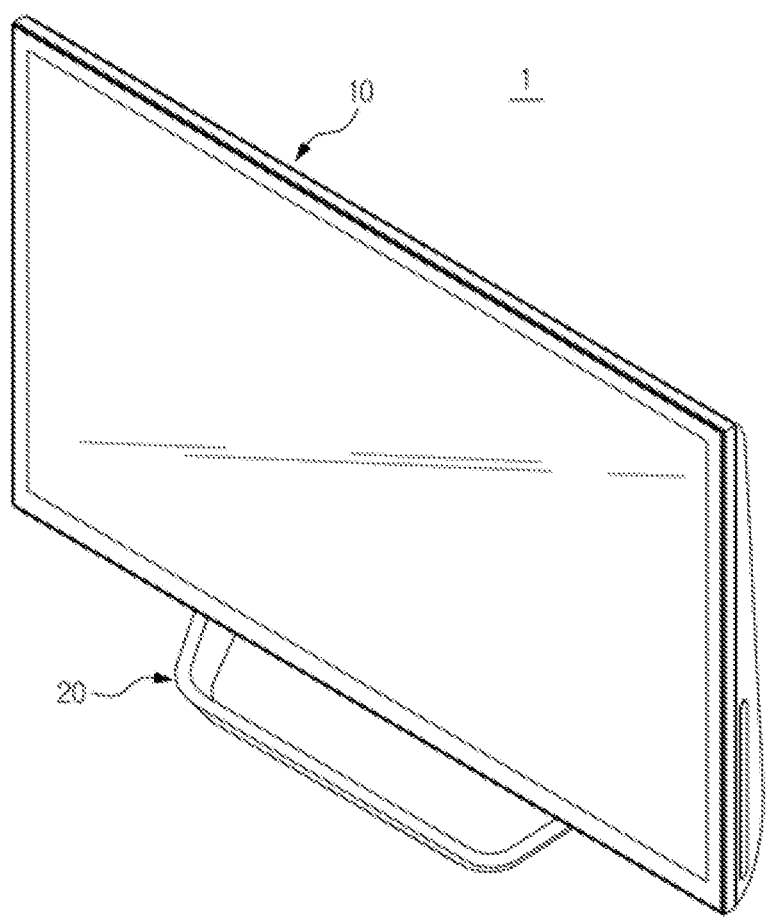

Reference will now be made in detail to the exemplary embodiments, examples of which are illustrated in the accompanying drawings, wherein like reference numerals refer to like elements throughout.

Figure 2:
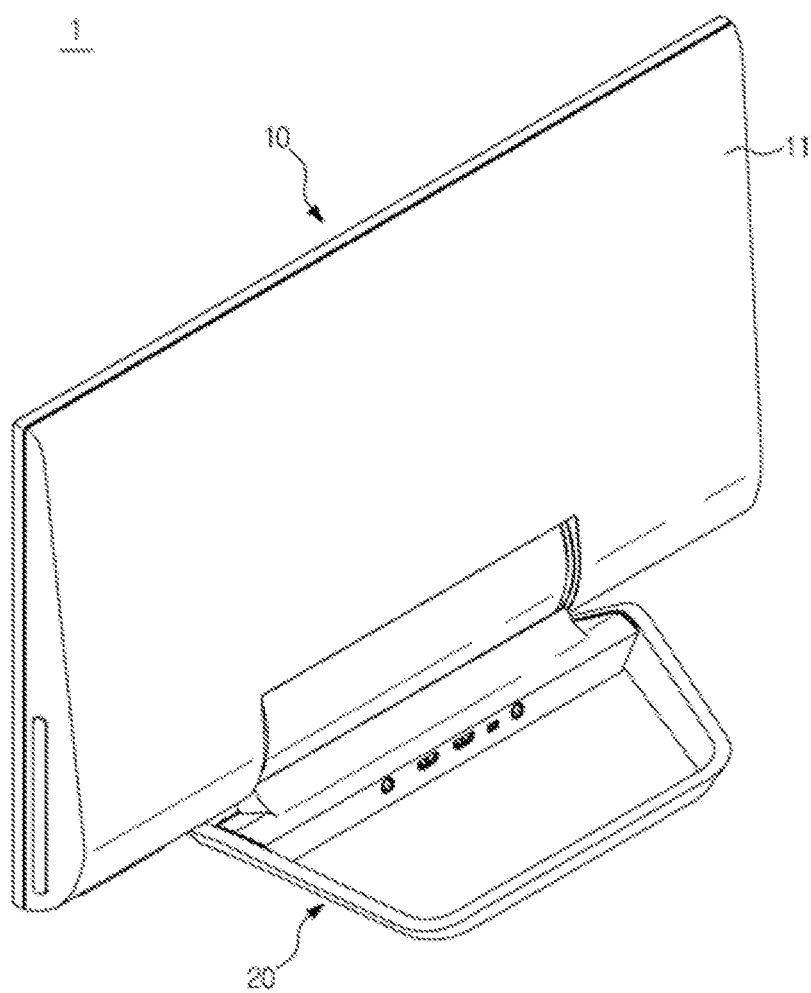
FIG. 2 is a perspective view of a display apparatus viewed from a rear side according to an exemplary embodiment.
Figure 3:
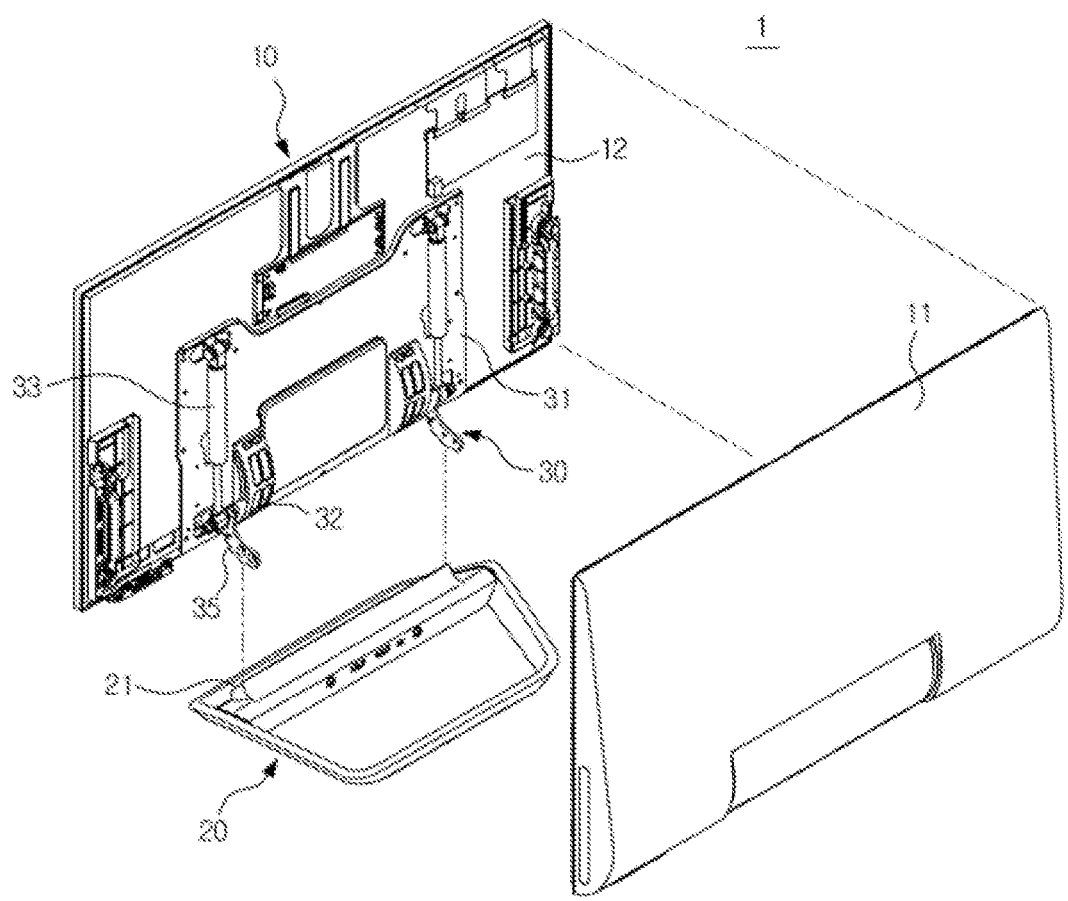
FIG. 3 is a view which illustrates a rear cover of the display apparatus separated from a stand according to an exemplary embodiment.

FIG. 1 is a perspective view of a display apparatus viewed from a front side according to an exemplary embodiment, FIG. 2 is a perspective view of a display apparatus viewed from a rear side according to an exemplary embodiment, and FIG. 3 is a view which illustrates a rear cover of the display apparatus separated from a stand according to an exemplary embodiment.

Referring to FIGS. 1 to 3, a display apparatus 1 according to an exemplary embodiment includes a display 10 and a stand 20. The display 10 is mounted on the stand 20 to be supported by the stand, and the stand 20 is placed on a bottom surface. The display 10 may be mounted on the stand 20 to be tilted by a hinge device 30 (FIG. 3).

An image is displayed on the front surface of the display 10. The front surface of the display 10 may be implemented as a touch screen. A user may directly touch an image displayed on the front surface of the display while viewing the image on the front surface of the display 10.

A frame 12 is disposed on the rear side of the display 10. The frame 12 may include an LCD device for displaying an image on the front surface of the display 10, and various circuit parts mounted thereon. The hinge device 30 may be mounted on the rear surface of the frame 12. The rear surface of the frame 12 may be covered by the rear cover 11 in order to prevent the hinge device 30 from being externally exposed.

The display 10 is supported by the stand 20. The stand 20 may be connected to the hinge device 30. That is, the display 10 may be mounted on the stand 20 via the hinge device 30. The display 10 may be mounted on the stand 20 such that it slides to be tilted. The stand 20 may include a connector 21 to be connected to the hinge device 30. For example, the hinge device 30 may be coupled to the stand 20 via a coupling member penetrating the hinge device 30 and the connector 21.

The detailed structure of the hinge device 30 will be described with reference to the drawings below.

Figure 4:
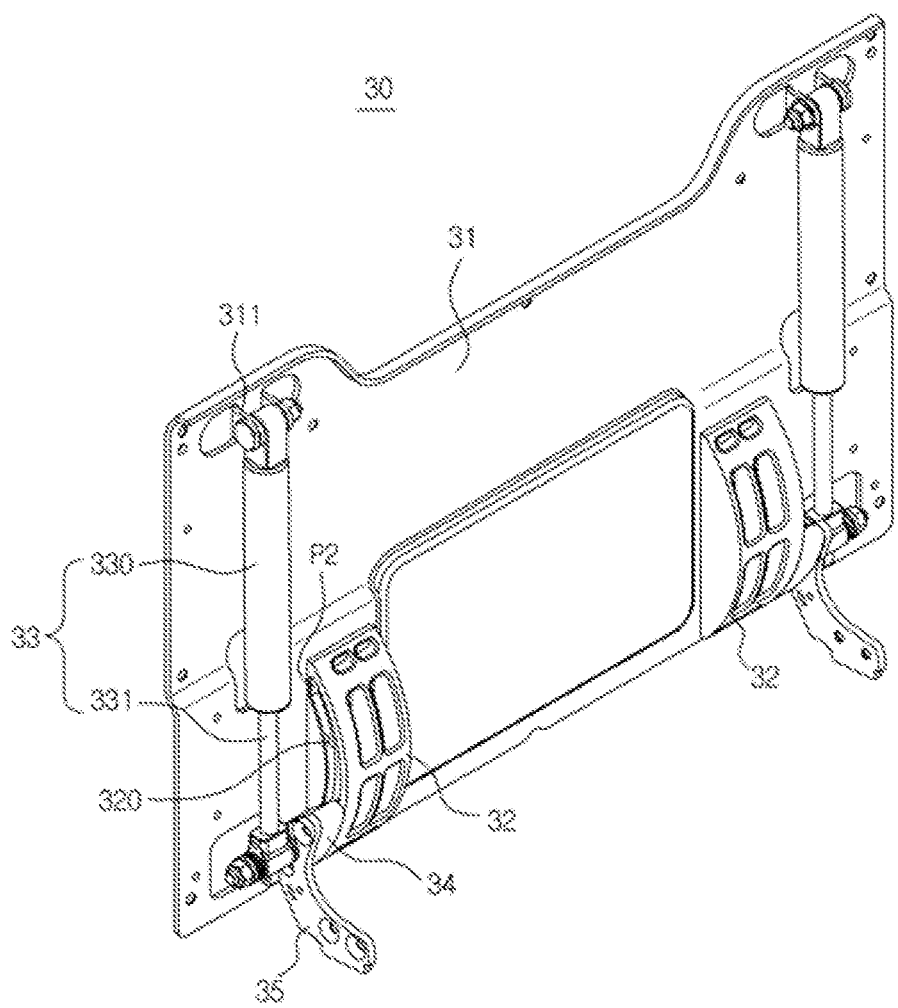
FIG. 4 is a view of a hinge device before another display is tilted thereinto according to an exemplary embodiment.
Figure 5:
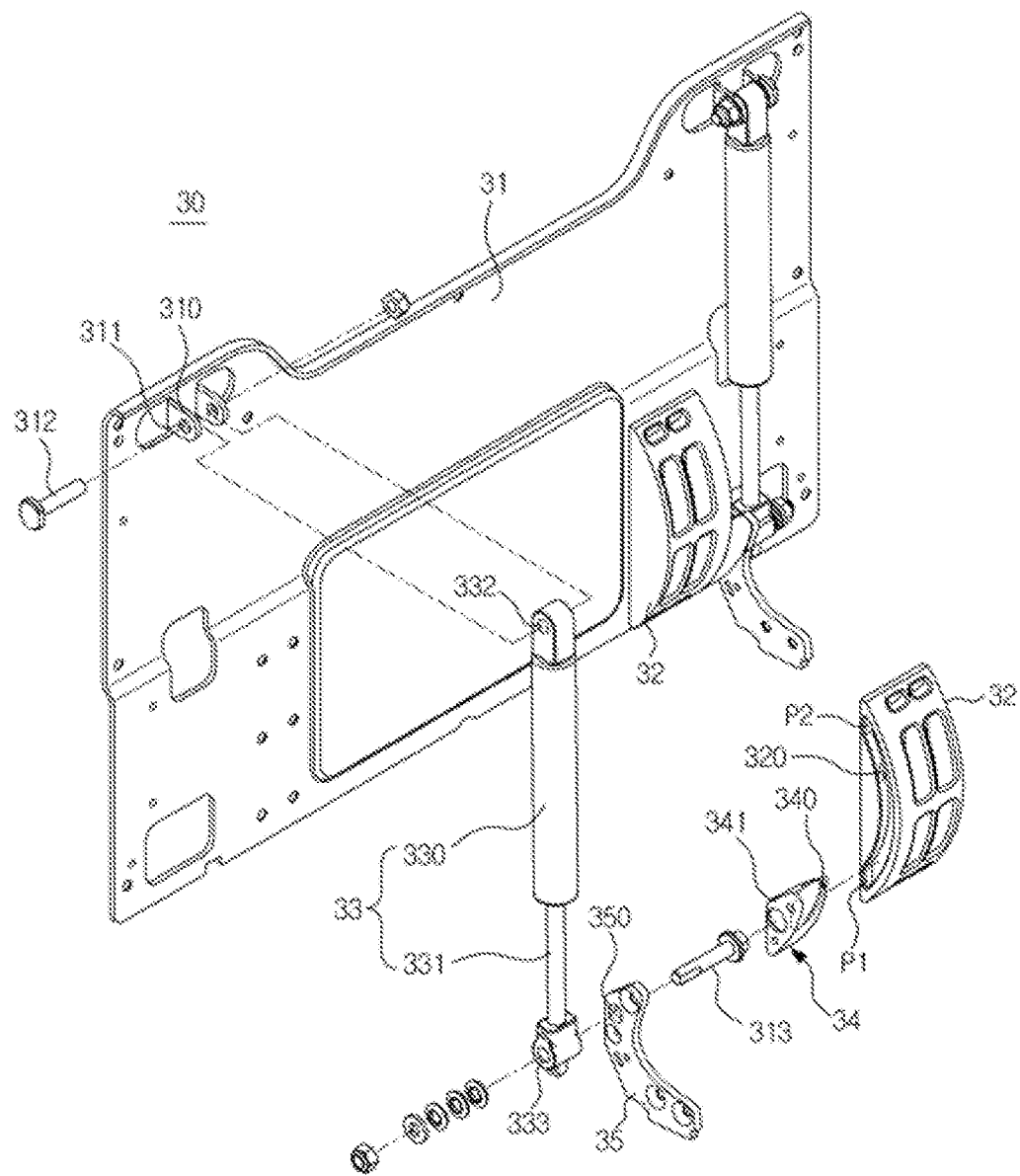
FIG. 5 is an exploded perspective view of the hinge device of FIG. 4.

FIG. 4 is a view of a hinge device before another display is tilted thereinto according to an exemplary embodiment. FIG. 5 is an exploded perspective view of the hinge device of FIG. 4, and FIG. 6 is a view of the hinge device after a display apparatus is tilted thereinto according to an exemplary embodiment.

Figure 6:
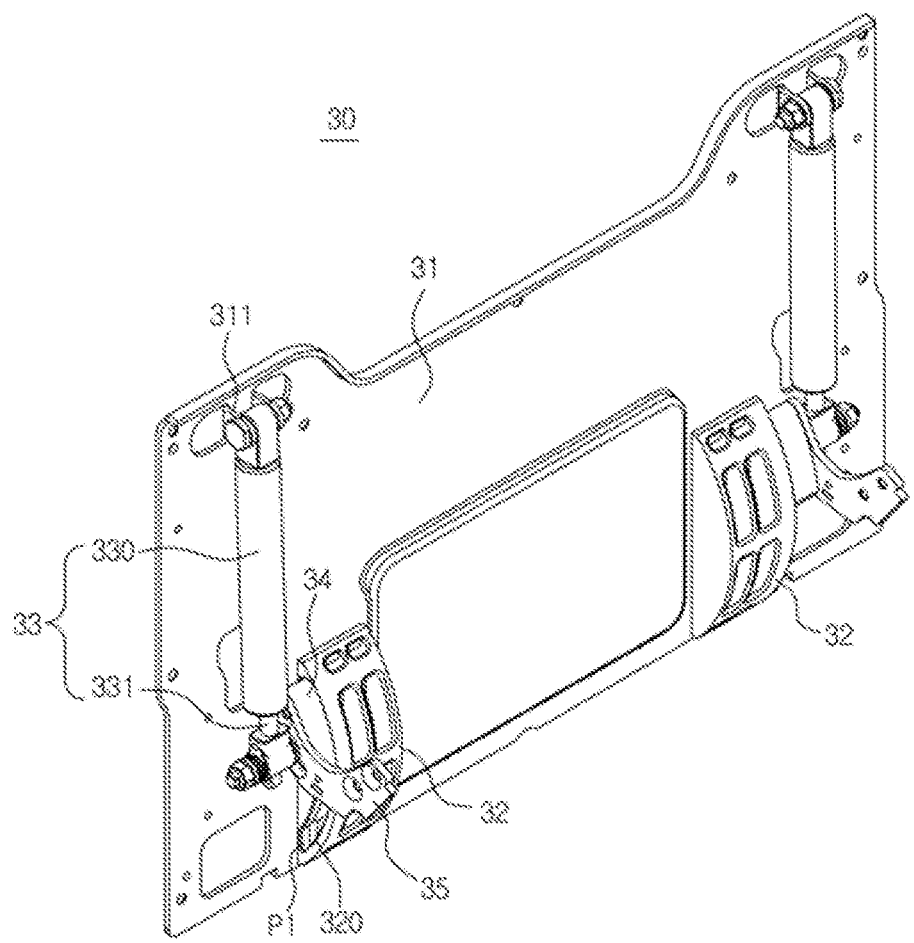
FIG. 6 is a view of the hinge device after a display apparatus is tilted thereinto according to an exemplary embodiment.

Referring to FIGS. 4 to 6, the hinge device 30 according to an exemplary embodiment includes a guide member 32, a hydraulic hinge 33, a latch member 34 and a fixing bracket 35. At least one hinge device 30 may be formed on the rear surface of the display 10. For example, two hinge devices 30 may be formed on the rear surface of the display 10.

The hinge device 30 may further include a fixing panel 31. The fixing panel 31 may be fixed to the frame 12 of the display 10 such that the hinge device 30 is coupled to the display 10. Specifically, the front surface of the fixing panel 31 may be in contact with the rear surface of the frame 12, and the fixing panel 31 may be fixed to the rear surface of the frame 12 by a coupling device such as a coupling member or an adhesive.

The guide 32 and the hydraulic hinge 33 may be mounted on the rear surface of the fixing panel 31. An exemplary embodiment in which the hinge device 30 includes the fixing panel 31, and the fixing panel 31 is mounted on the frame 12 will be described below.

The guide member 32 may be formed to protrude from the rear surface of the fixing panel 31. A rail member 320 may be formed on the guide 32. The rail member 320 may be formed in the shape of a groove on a side of the guide member 32. The rail 320 may guide the movement of the latch member 34. Separated from the fixing panel 31, the guide member 32 is formed through injection molding to be mounted on the rear surface of the fixing panel 31 or the rear surface of the frame 12. The guide member 32 and the fixing panel 31 may be integrally injected during manufacture.

The hydraulic hinge 33 may be mounted on a side of the fixing panel 31. The hydraulic hinge 33 may be mounted to rotate as the display 10 is tilted. For example, the hydraulic hinge 33 may be mounted on the fixing panel 31 to rotate with respect to a rotation axis 312. A projection member 310 through which a hole 311 is formed is located on the rear surface of the fixing panel 31, and a hole 332 which corresponds to the hole 311 is formed on a side of the hydraulic hinge 33. The rotation axis 312 penetrates the hole 311 formed on the fixing panel 31 and the 332 formed on the hydraulic hinge 33, and a fixing member having a greater diameter than the holes 311 and 332 is mounted on the rotation axis 312, so that the rotation axis 312 may not deviate from the holes 311 and 332. Consequently, the hydraulic hinge 33 may be rotatably mounted on the fixing panel 31.

The hydraulic hinge 33 may include a cylinder 330 and a piston 331. The diameter of the piston 331 may be formed smaller than that of the cylinder 330, and at least a part of the piston 331 is received in the cylinder 330 to reciprocate. That is, an external force applied to the display 10 causes the piston 331 to reciprocate in the cylinder 330, so that the hydraulic hinge 33 is reduced or extended, and the display 10 is tilted.

The cylinder 330 may receive fluids therein. The pressure of the fluids filling the cylinder 330 may enable the display 10 to be fixed unless there is an external force. Since a hydraulic hinge 33 of the related art may be used, the detailed constitution thereof will be omitted. In response to an the external force applied to the display 10 being removed, the display 10 is fixed by the hydraulic hinge 33 such that the display 10 does not move any more, and thus the hydraulic hinge may be referred to as a fixing member.

The latch member 34 and the fixing bracket 35 may be mounted on the other side of the hydraulic hinge 33. The latch member 34 includes a latch 340 and a connector 341. The connector 341 may be fixed to the other side of the hydraulic hinge 33. The latch 340 may protrude from the connector 341. The latch 340 may be formed to move along the rail member 320. Specifically, the latch 340 may move from P1 to P2 of the rail member 320 as the display 10 is tilted. Here, a tilting angle of the display 10 may be limited, depending on the length of the rail member 320.

The fixing bracket 35 may be mounted on the other side of the hydraulic hinge 33. The hydraulic hinge 33 may be mounted on the other side of the fixing bracket 35 such that the hydraulic hinge 33 rotates along rotation axis 313. For example, a hole 333 may be formed on the other side of the hydraulic hinge 33, and a hole 350 which corresponds to the hole 333 may be formed on the fixing bracket 35. The rotation axis 313 may penetrate the holes 333 and 350, and the other side of the hydraulic hinge 33 may be rotatably mounted on the fixing bracket 35.

One side of the fixing bracket 35 may be fixed to the stand 20. One side of the fixing bracket 35 may be coupled to the connector 21 fixed to the stand 20. Here, the fixing bracket 35 may be fixed not to move with respect to the stand 20 even though the display 10 is tilted.

Operations of the hinge device 30 according to a tilting operation of the display 10 will be described below.

Figure 7:
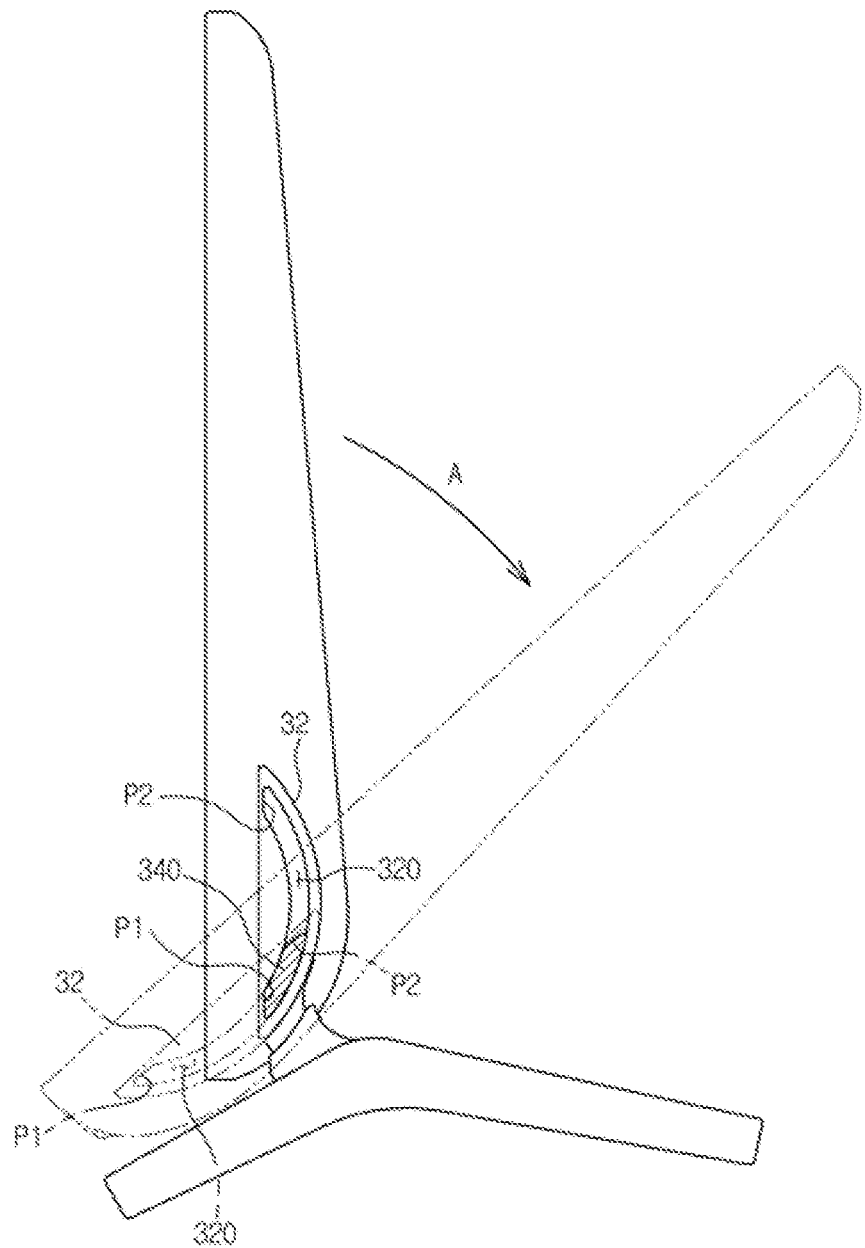
FIG. 7 illustrates a tilted display according to an exemplary embodiment.

FIG. 7 illustrates a tilted display according to an exemplary embodiment.

Referring to FIG. 7, in response to the display 10 being installed vertical to a bottom surface, the latch 340 may be placed at a position P1 of the rail member 320, and the hydraulic hinge 33 may be placed while it is in tight contact with the fixing panel 31. In response to an external force being applied to the display 10, the display 10 moves in direction A. The latch 340 slides in a direction P2 along the rail member 320, and the hydraulic hinge 33 rotates with respect to the center of the axis of rotation 312.

A greater force than a force by hydraulic power of the hydraulic hinge 33 may be applied as the external force. In response to the latch 340 sliding along the rail member 320 to be placed at the position P2, the display 10 not being tilted any more even though an external force is applied. When the latch 340 is positioned between the positions P1 and P2, and the external force applied to the display 10 is removed, the display 10 is supported by the hydraulic power of the hydraulic hinge 33, and the latch 340 may stop sliding while it is positioned at the center.

As previously stated, as the latch 340 slides in the rail member 320, and the display 10 is tilted, the display 10 may be tilted at a large angle. Therefore, a user may tilt the display 10 to form the smallest possible angle with respect to the bottom surface, so that the display 10 may be conveniently operated by touching the display.

Since the hinge device 30 is implemented in a sliding manner, a display apparatus 1 may be implemented to be slim, and the hinge device 30 is covered with the rear cover 11, so that the display apparatus 1 has an elegant appearance. Also, the hydraulic hinge 33 is used to enable the display 10 to smoothly move during the tilting operation, so that a user's convenience thereof is improved.

Figure 8:
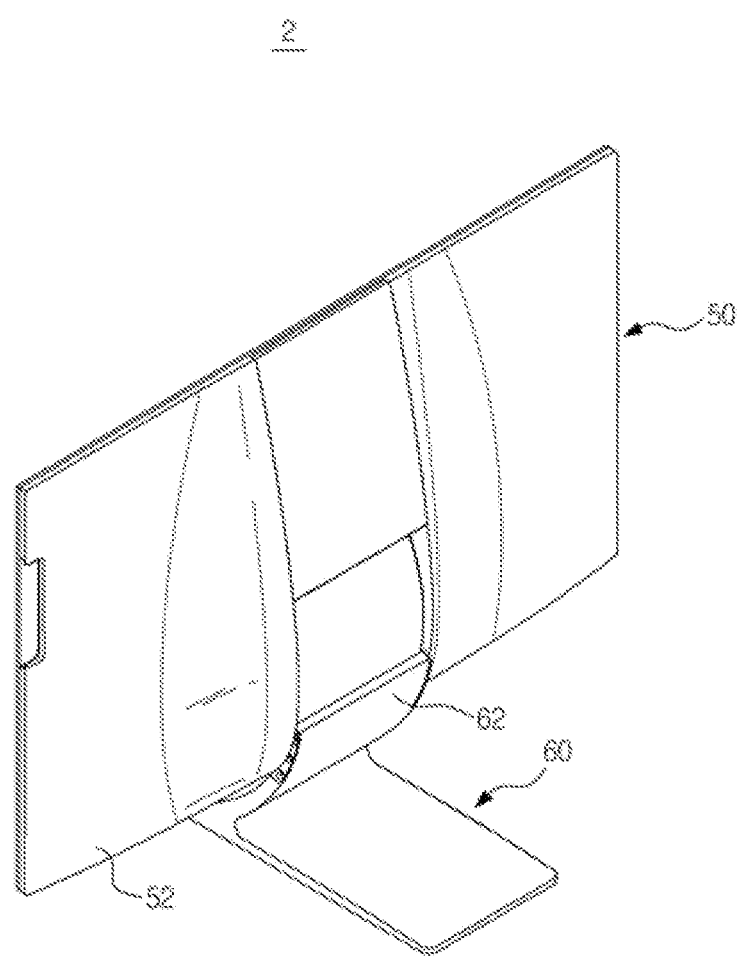
FIG. 8 is a perspective view of a display apparatus viewed from a rear side according to another exemplary embodiment.
Figure 9:
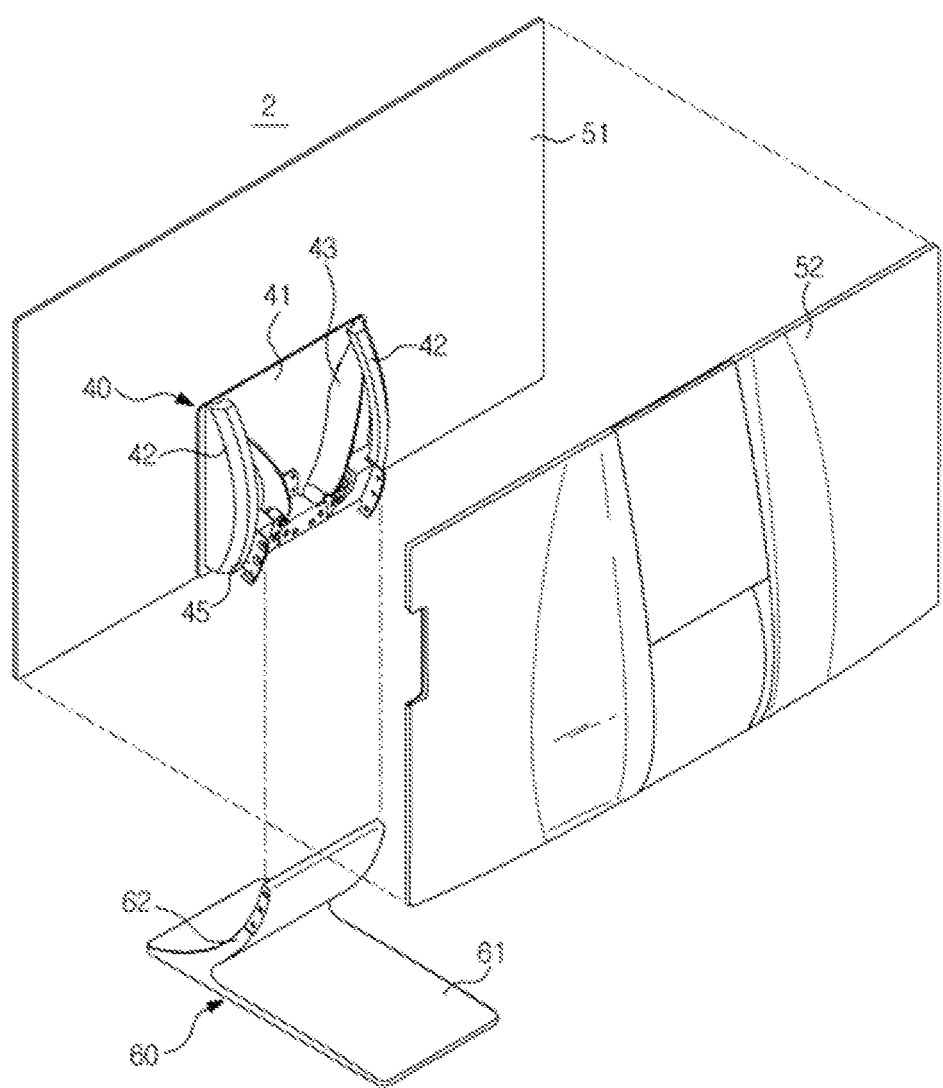
FIG. 9 illustrates a rear cover of the display apparatus separated from the stand according to another exemplary embodiment.

FIG. 8 is a perspective view of a display apparatus viewed from a rear side according to another exemplary embodiment, and FIG. 9 illustrates a rear cover of the display apparatus separated from the stand according to another exemplary embodiment.

Referring to FIGS. 8 and 9, a display apparatus 2 according to another exemplary embodiment includes a display 50 and a stand 60. The display 50 is mounted on the stand 60 to be supported, and the stand 60 is placed on a bottom surface. The display 50 may be mounted on the stand 60 to be tilted by a hinge device 40.

An image is displayed on a front surface of the display 50. The front surface of the display 50 may be implemented as of a touch screen. A user may directly touch the image displayed on the front surface of the display while viewing the image on the front surface of the display 50.

A frame 51 may be disposed on the rear side of the display 50. The frame 51 may include an LCD device for displaying an image on the front surface of the display 50, and various circuit parts may be mounted thereon. The hinge device 40 may be mounted on the rear surface of the frame 51. The rear surface of the frame 51 may be covered with the rear cover 52 to prevent the hinge device 40 from being externally exposed.

The display 50 is supported by the stand 60. The stand 60 may be connected to hinge device 40. That is, the display 50 may be mounted on the stand 60 via the hinge device 40. The display 50 may be mounted on stand 60, so that the display slides as it is tilted.

The stand 60 may include a base 61 and a connector 62 extended from the base 61. The connector 62 may be connected to the hinge device 40. For example, the connector 62 may be formed to upwardly protrude from the stand 60. The side of the hinge device 40 may be coupled to the stand 60 via a connection member penetrating a side of the hinge device 40 and the connector 62.

The detailed constitution of the hinge device 40 will be described with reference to the drawings.

Figure 10:
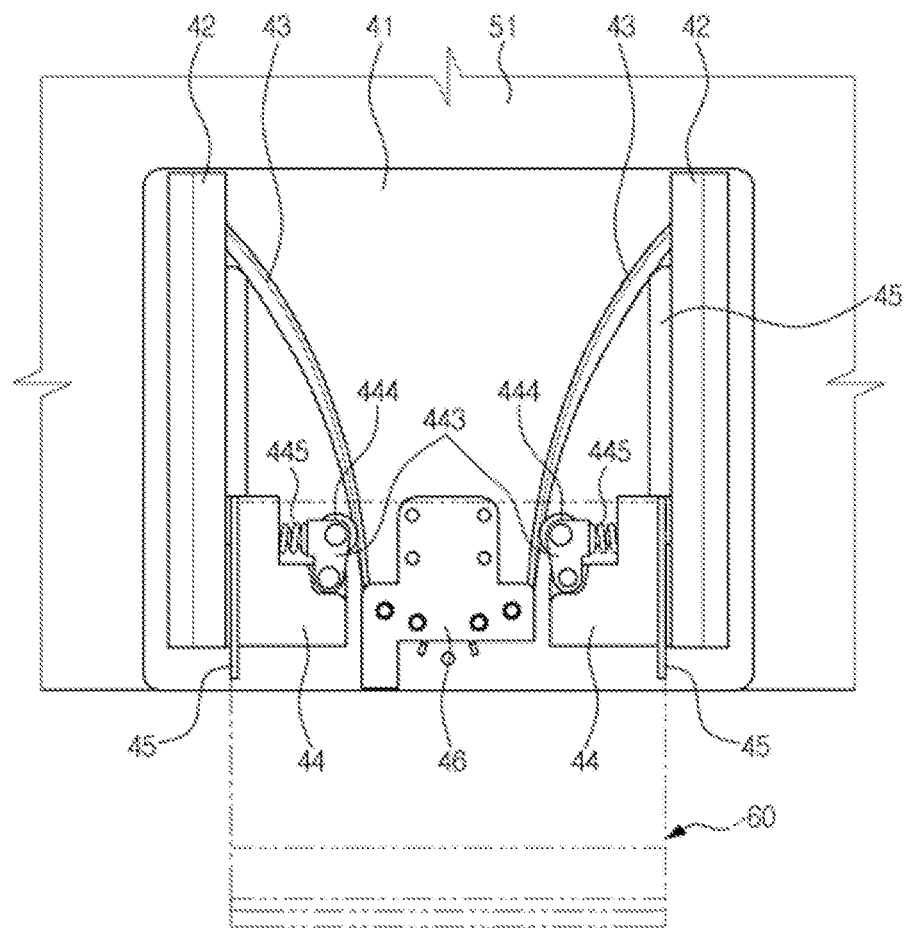
FIG. 10 illustrates a hinge device before a display apparatus is tilted thereinto according to another exemplary embodiment.
Figure 11:
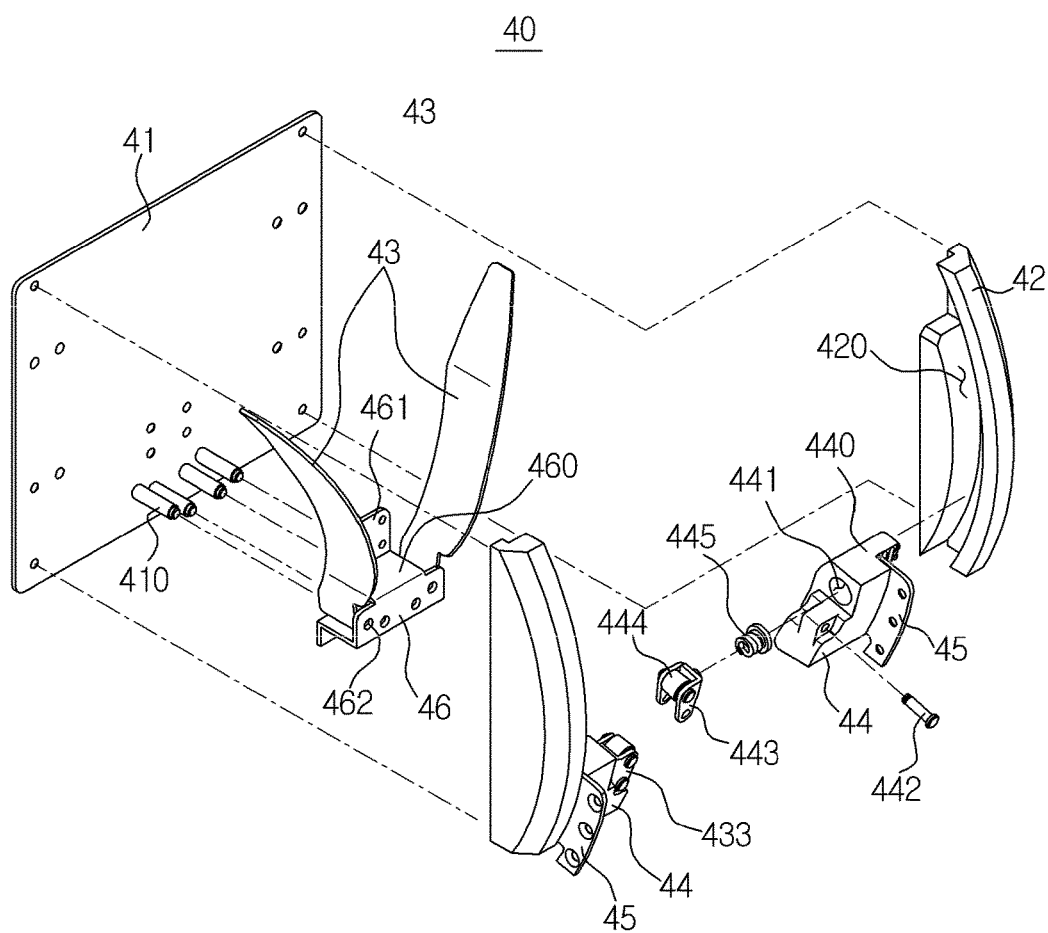
FIG. 11 is an exploded perspective view of the hinge device of FIG. 10.
Figure 12:
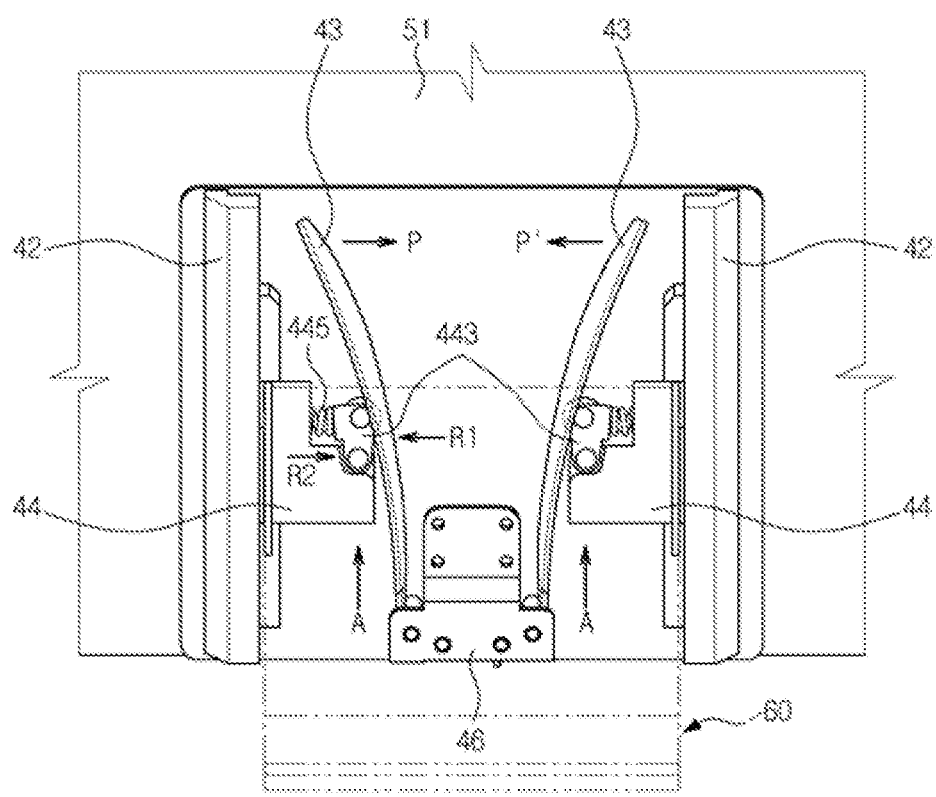
FIG. 12 illustrates a hinge device after a display apparatus is tilted thereinto according to another exemplary embodiment.

FIG. 10 illustrates a hinge device before a display apparatus is tilted thereinto according to another exemplary embodiment, FIG. 11 is an exploded perspective view of the hinge device of FIG. 10, and FIG. 12 illustrates a hinge device after a display apparatus is tilted thereinto according to another exemplary embodiment.

Referring to FIGS. 10 to 12, a hinge device 40 according to another exemplary embodiment includes a fixing panel 41, a guide 42, a fixing member 43 and a pressure device 44. The fixing panel 41 may be mounted on a rear surface of a frame 51 of a display 50. The guide 42 and the fixing member 43 may be formed on the fixing panel 41. The pressure member 44 may be mounted on a connector 62 of the stand 60.

The fixing member 43 may be mounted on the fixing panel 41. One end of the fixing member 43 may be mounted on the fixing panel 41 to be fixed thereto, and the other end thereof may be formed as a free end. The fixing member 43 may be applied with pressure by the pressure member 44 until the display 50 is tilted. The fixing member 43 may be elastically formed, and even though the fixing member 43 is applied with pressure by pressure member 44 to be transformed, when the pressure member 44 is released from a pressure state, the fixing member 43 may be configured to return to its original shape. For example, the fixing member 43 may be implemented as a leaf spring. The fixing member 43 may be configured to be elastic in a direction of pushing the pressure member 44 toward the external side of the display 50.

A fixing bracket 46 may include a bracket body 460 and an extension 461. The extension member 461 may extend from the bracket body 460. The fixing member 43 may be coupled to the bracket body 460. After the fixing member 43 is coupled to the bracket body 460, one surface of the extension member 461 may be disposed to be in contact with the fixing panel 41. The extension member 461 may be coupled to the fixing panel 41 by a coupling member which penetrates the extension member 461 and the fixing panel 41. As a result, the fixing bracket 46 may be fixed to the fixing panel 41, and the fixing member 43 mounted on the fixing bracket 46 may be mounted on the fixing panel 41.

The fixing panel 41 may include a plurality of fixing ribs 410 to be mounted on the fixing bracket 46. The fixing bracket 46 may include a plurality of fixing holes 462 such that the fixing ribs 410 penetrate the holes. The fixing holes 462 may be formed on the bracket body 460 of the fixing ribs 410. The fixing bracket 46 may be disposed such that the fixing ribs 410 are inserted into the fixing holes 462. After the fixing ribs 410 are inserted into the fixing holes 462, the fixing bracket 46 may be more reliably mounted on the fixing panel 41. Even though the pressure member 44 applies pressure to the guide member 42, the fixing bracket 46 may be prevented from flowing.

The fixing panel 41 may include guide member 42. A guide groove 420 guiding the movement of the pressure member 44 may be formed on the guide member 42. The guide member 42 may be disposed such that the guide groove 420 may be extended from a lower part to an upper part of the display 50 on which the stand 60 is disposed. The guide member 42 may be disposed adjacent to the fixing member 43 such that the pressure member 44, the movement of which is guided by the guide member 42, applies pressure to the fixing member 43.

The pressure member 44 may be mounted on the stand 60. Specifically, the pressure member 44 may be mounted on the connector 62 of the stand 60. The pressure member 44 may be coupled to the stand 60 via a connection bracket 45. One side of the connection bracket 45 may be coupled to the pressure member 44, and the other side thereof may be coupled to the connector 62 of the stand 60. The connection bracket 45 may be integrally injected together with the pressure device 44. A coupling groove may be formed on a side of the connector 62 of the stand 60, and the connection bracket 45 may be mounted on the connector 62 of the stand 60 via a coupling member which penetrates the coupling groove formed on the connection bracket 45 and the side of the connector 62. As a result, the pressure member 44 coupled to the connection bracket 45 may be fixed.

A roller part may be formed on one side of the pressure member 44. The roller part includes a roller bracket 443 and a roller 444. The roller 444 may be rotatably mounted on the roller bracket 443. When the display 50 is tilted, the roller 444 may slide on one surface of the fixing member 43. The roller bracket 443 may be mounted on the pressure member 44 by a shaft 442 which penetrates one side of the roller bracket 443 and one side of the pressure member 44. The roller bracket 443 may be formed to rotate with respect to the shaft 442.

An elastic member insertion groove 441 in which an elastic member 445 is received may be formed one side of the pressure member 44. The elastic member 445 received in the elastic member insertion groove 441 may be formed to transfer an elastic force to the roller bracket 443. A direction in which the elastic force applied to the roller bracket 443 by the elastic member 445 may be opposite to a direction in which the elastic force is applied by the fixing member 43 to the roller 444.

Specifically, in response to the display 50 being applied with pressure in a rear direction, the roller 444 slides along one surface of the fixing member 43, and the fixing member 43 may apply an elastic force of pushing the roller 444 to the outside of the display 50 to the roller 444 via the roller bracket 443. The elastic member 445 may apply a force of pushing the pressure member 44 to the inside of the display 50. As a result, the display 50 may be tilted at a predetermined angle by the elastic force of the fixing member 43 and that of the elastic member 445 to be fixed.

A latch 440 that can be guided by the guide member 42 may protrude from the other side of the pressure member 44. The latch 440 may be inserted into the guide groove 420 formed on the guide 42. In response to the display 50 being tilted, the latch 440 may move along the guide member 42.

Operations of each member until the display 50 is tilted will be described below.

Figure 13:
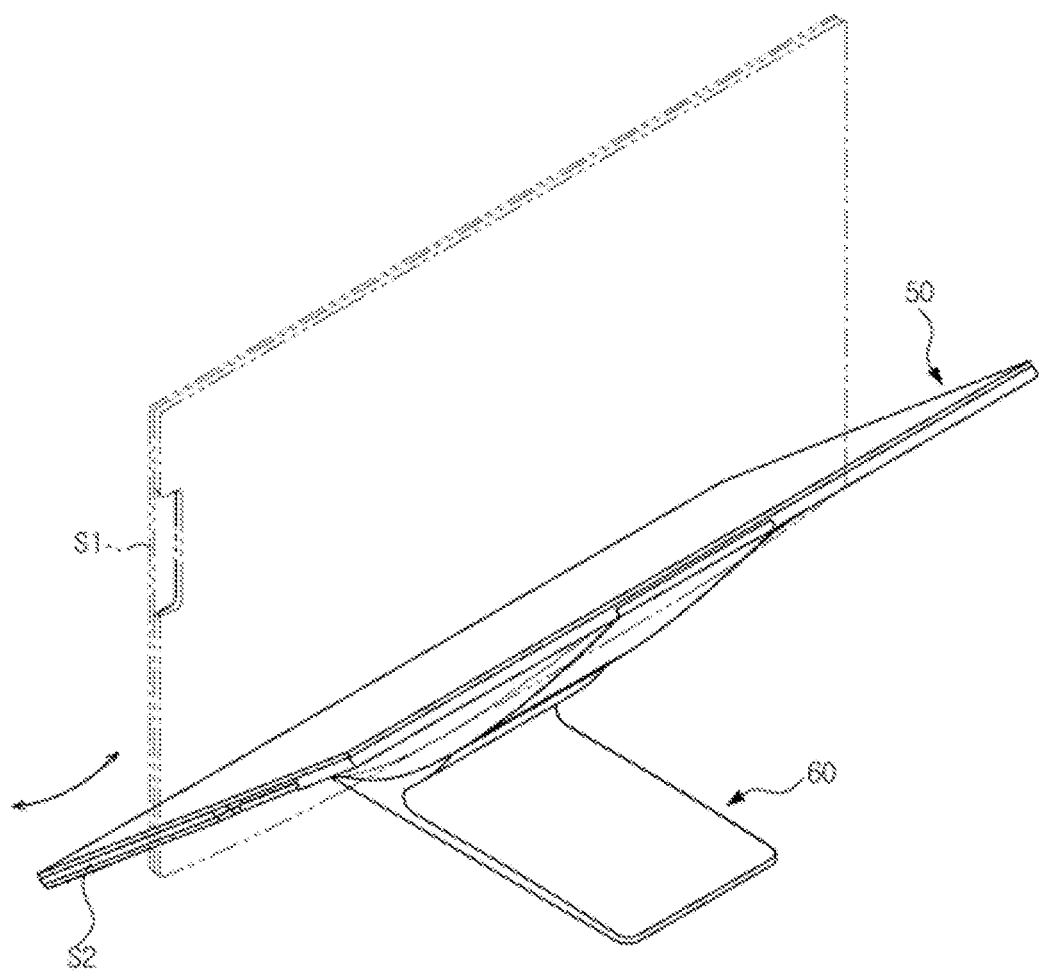
FIG. 13 illustrates a hinge device after the display is tilted according to an exemplary embodiment.

FIG. 13 illustrates a hinge device after the display is tilted according to an exemplary embodiment.

Referring to FIGS. 10, 12 and 13, the guide 42, the fixing member 43 and the pressure member 44 may be disposed at both sides with respect to the fixing bracket 46 disposed at a lower center of the display 50, according to an exemplary embodiment.

When the display 50 is tilted to be from a state S1 in which the display is vertical to a bottom surface to a state S2, the pressure member 44 may be fixed to the stand 60 such that the roller 444 slides in an A direction along one surface of the fixing member 43. When the roller 444 slides in an A direction along the surface of the fixing member 43, the other side of the fixing member 43 may move toward the center of the display 50. Here, the fixing member 43 may apply an elastic force in an R1 direction to the roller 444. At the same time, an elastic force R2 in an opposite direction to the R1 may be applied to the roller 444 by the elastic member 445. When the display 50 is tilted at a predetermined angle, and an external force is removed, a force in the R1 direction of the fixing member 43 and a force in the R2 direction of the elastic member 445 enables the roller 444 to be fixed without sliding on the surface of the fixing member 43. Therefore, the display 50 can be fixed when the display 50 is tilted at the predetermined angle.

According to an exemplary embodiment, various tilting angles of a display can be implemented, and a slim hinge device may be implemented, so that a display apparatus with a slim design can be implemented. Since the display rotates with a tilting angle across a large range, a user can conveniently use the display apparatus, quality of use can be improved during a tilting operation, and slim and elegant appearance can be implemented.

Although a few exemplary embodiments have been shown and described, it would be appreciated by those skilled in the art that changes may be made in these exemplary embodiments without departing from the principles and spirit of the invention, the scope of which is defined in the claims and their equivalents.

What is claimed is:

1. A touch-screen display apparatus, comprising
   a display configured to display an image on a front surface thereof;
   a rear cover to cover a rear surface of the display;
   a stand configured to support the display; and a hinge device configured to connect the display to the stand such that the display is tilted,
   wherein the hinge device includes a curved guide member formed on the rear surface of the display, a latch connected to a fixing bracket and configured to slide along the curved guide member when the display is tilted, the fixing bracket fixed to the stand, and a fixing member configured to fix the display such that the display is not moved when an external force applied to the display is removed,
   wherein both the curved guide member and the fixing member are accommodated within an inner space between the display and the rear cover to prevent the curved guide member and the fixing member from being externally exposed so that the display has a lower portion having a thickness greater than that of an upper portion of the display,
   wherein a first end of the fixing bracket is fixed to the stand and a second end of the fixing bracket is rotably fixed to the fixing member, and wherein entire portion of the fixing bracket is immobile with respect to the stand hen the display is tilted.

2. The touch-screen display apparatus according to claim 1, wherein the fixing member is a hydraulic hinge in which fluids are received in a cylinder.

3. The touch-screen display apparatus according to claim 2, wherein the hydraulic hinge includes a piston received in the cylinder, and the piston reciprocates in the cylinder when a force greater than the hydraulic power of the hydraulic hinge is applied to the display.

4. The touch-screen display apparatus according to claim 3, wherein the hydraulic hinge is rotatably mounted on the fixing bracket along the axis of rotation.

5. The touch-screen display apparatus according to claim 3, wherein the hydraulic hinge includes a side mounted on the display, and the other side mounted on the stand, so that the hydraulic hinge is reduced or extended by the external force applied to the display, and the display is tilted.

6. The touch-screen display apparatus according to claim 2, wherein the hydraulic hinge includes a side mounted on the rear surface of the display by an axis of rotation, and rotates with respect to the axis of rotation when the display is tilted.

7. The touch-screen display apparatus according to claim 1, wherein the curved guide member includes a rail member that slides by inserting the latch into the curved guide member.

8. The touch-screen display apparatus according to claim 7, wherein the display has a tilting angle limited by the length of the rail member.

9. The touch-screen display apparatus according to claim 1, wherein the lower portion of the display is configured to be supported on an upper surface of the stand when the display is fully tilted.

10. A hinge device mounted on a stand such that a touch-screen display is tilted, comprising:
    a rear cover to cover a rear surface of the touch-screen display;
    a curved guide member formed on the rear surface of the touch-screen display;
    a latch connected to a fixing bracket and configured to slide along the curved guide member when the touch-screen display is tilted, the fixing bracket being fixed to the stand; and
    a fixing member mounted on the rear surface of the touch-screen display, and configured to support the display such that the display is maintained in a tilted position at a predetermined angle,
    wherein both the curved guide member and the fixing member are accommodated within an inner space between the display and the rear cover to prevent the curved guide member and the fixing member from being externally exposed so that the display has a lower portion having a thickness greater than that of an upper portion of display,
    wherein a first end of the fixing bracket is fixed to the stand and a second end of the fixing bracket is rotably fixed to the fixing member, and wherein entire portion of the fixing bracket is immobile with respect to the stand when the touch-screen display is tilted.

11. The hinge device according to claim 10, wherein the fixing member includes a hydraulic hinge in which fluids are filled in a cylinder, and the touch-screen display is tilted only when an external force greater than the hydraulic power in the cylinder is applied.

12. The hinge device according to claim 11, wherein the hydraulic hinge includes one side mounted on the rear surface of the touch-screen display, and the other side connected to the stand, so that the hydraulic hinge is reduced or extended as the touch-screen display is tilted.

13. A touch-screen display apparatus, comprising:
    a rear cover to cover a rear surface of the display;
    a hinge device configured to connect a display to a stand such that the display is tilted,
    wherein the hinge device includes a curved guide member, a fixing bracket fixed to the stand, a latch connected to the fixing bracket and configured to slide along the curved guide member when an external force is provided to tilt the display, and a fixing member configured to fix the display such that the display is not moved when the external force applied to the display is removed,
    wherein both the curved guide member and the fixing member are accommodated within an inner space between the display and the rear cover to prevent the curved guide member and the fixing member from being externally exposed so that the display has a lower portion having a thickness greater than that of an upper portion of display,
    wherein a first end of the fixing bracket is fixed to the stand and a second end of the fixing bracket is rotatably fixed to the fixing member, and
    wherein entire portion of the fixing bracket is immobile with respect to the stand when the display is tilted.

14. The touch-screen display apparatus of claim 13, further comprising a display configured to display an image on a front surface thereof.

15. The touch-screen display apparatus of claim 14, wherein the stand is configured to support the display.

16. The touch-screen display apparatus of claim 13, wherein the curved guide member includes a rail member that slides by inserting the latch into the curved guide member.

17. The touch-screen display apparatus according to claim 13, wherein the lower portion of the display is configured to be supported on an upper surface of the stand when the display is fully tilted.

* * * * *